(12) United States Patent
Taniguchi et al.

(10) Patent No.: US 10,381,446 B2
(45) Date of Patent: Aug. 13, 2019

(54) MEMORY CELL AND NON-VOLATILE SEMICONDUCTOR STORAGE DEVICE

(71) Applicant: FLOADIA CORPORATION, Kodaira-shi, Tokyo (JP)

(72) Inventors: Yasuhiro Taniguchi, Kodaira (JP); Fukuo Owada, Kodaira (JP); Yasuhiko Kawashima, Kodaira (JP); Shinji Yoshida, Kodaira (JP); Kosuke Okuyama, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 8 days.

(21) Appl. No.: 15/577,147

(22) PCT Filed: May 27, 2016

(86) PCT No.: PCT/JP2016/065758
§ 371 (c)(1),
(2) Date: Nov. 27, 2017

(87) PCT Pub. No.: WO2016/194827
PCT Pub. Date: Dec. 8, 2016

(65) Prior Publication Data
US 2018/0197958 A1 Jul. 12, 2018

(30) Foreign Application Priority Data
Jun. 1, 2015 (JP) .................................. 2015-111190

(51) Int. Cl.
*H01L 27/11568* (2017.01)
*H01L 29/40* (2006.01)
(Continued)

(52) U.S. Cl.
CPC .......... *H01L 29/408* (2013.01); *H01L 27/115* (2013.01); *H01L 27/11568* (2013.01);
(Continued)

(58) Field of Classification Search
CPC ............. H01L 29/408; H01L 27/11568; H01L 29/42344; H01L 29/792
See application file for complete search history.

(56) References Cited

U.S. PATENT DOCUMENTS 6,432,773 B1 * 8/2002 Gerber .............. H01L 21/28273
257/E21.209
2002/0074594 A1 6/2002 Katayama et al.
(Continued)

FOREIGN PATENT DOCUMENTS

JP 2002-164449 A 6/2002
JP 2005-142354 A 6/2005
(Continued)

OTHER PUBLICATIONS

Extended European Search Report issued in Patent Application No. EP 16 80 3262.1 dated May 29, 2018.
(Continued)

*Primary Examiner* — Thomas L Dickey
(74) *Attorney, Agent, or Firm* — Pearne & Gordon LLP

(57) ABSTRACT

A memory cell and a non-volatile semiconductor memory device are disclosed. Nitride sidewall layers are respectively disposed in a first sidewall spacer and a second sidewall spacer, to separate a memory gate electrode and a first select gate electrode from each other and the memory gate electrode and a second select gate electrode from each other. Hence, a breakdown voltage is improved around the memory gate electrode as compared with a conventional case in which the first sidewall spacer and the second sidewall spacer are simply made of insulating oxide films. The nitride sidewall layers are disposed farther from a memory well than a charge storage layer. Hence, charge is unlikely to be injected into the nitride sidewall layers at charge injection from the memory well into the charge
(Continued)

storage layer, thereby preventing an operation failure due to charge storage in a region other than the charge storage layer.

7 Claims, 6 Drawing Sheets

(51) Int. Cl.
    *H01L 29/788*     (2006.01)
    *H01L 29/792*     (2006.01)
    *H01L 27/115*     (2017.01)
    *H01L 29/423*     (2006.01)
    *G11C 16/04*     (2006.01)
    *G11C 16/10*     (2006.01)
    *G11C 16/26*     (2006.01)
    *H01L 29/66*     (2006.01)

(52) U.S. Cl.
    CPC ...... *H01L 29/42344* (2013.01); *H01L 29/788* (2013.01); *H01L 29/792* (2013.01); *G11C 16/0466* (2013.01); *G11C 16/10* (2013.01); *G11C 16/26* (2013.01); *H01L 29/401* (2013.01); *H01L 29/66833* (2013.01)

(56) References Cited

U.S. PATENT DOCUMENTS

| | | | |
|---|---|---|---|
| 2004/0233713 A1 | 11/2004 | Iwase et al. | |
| 2006/0214256 A1 | 9/2006 | Shinohara et al. | |
| 2007/0257307 A1* | 11/2007 | Chen | H01L 27/11568 257/324 |
| 2010/0322013 A1 | 12/2010 | Ishimaru et al. | |
| 2014/0175533 A1 | 6/2014 | Kwon | |

FOREIGN PATENT DOCUMENTS

| | | |
|---|---|---|
| JP | 2010-278314 A | 12/2010 |
| JP | 2011-129816 A | 6/2011 |

OTHER PUBLICATIONS

International Search Report issued in Patent Application No. PCT/JP2016/065758 dated Aug. 9, 2016.
Written Opinion issued in Patent Application No. PCT/JP2016/065758 dated Aug. 9, 2016.
Schuegraf, Klaus F., et al., "Hole Injection SiO2 Breakdown Model for Very Low Voltage Lifetime Extrapolation" IEEE Transaction on Electron Devices, vol. 41, No. 5, May 1994, pp. 761-767.

* cited by examiner

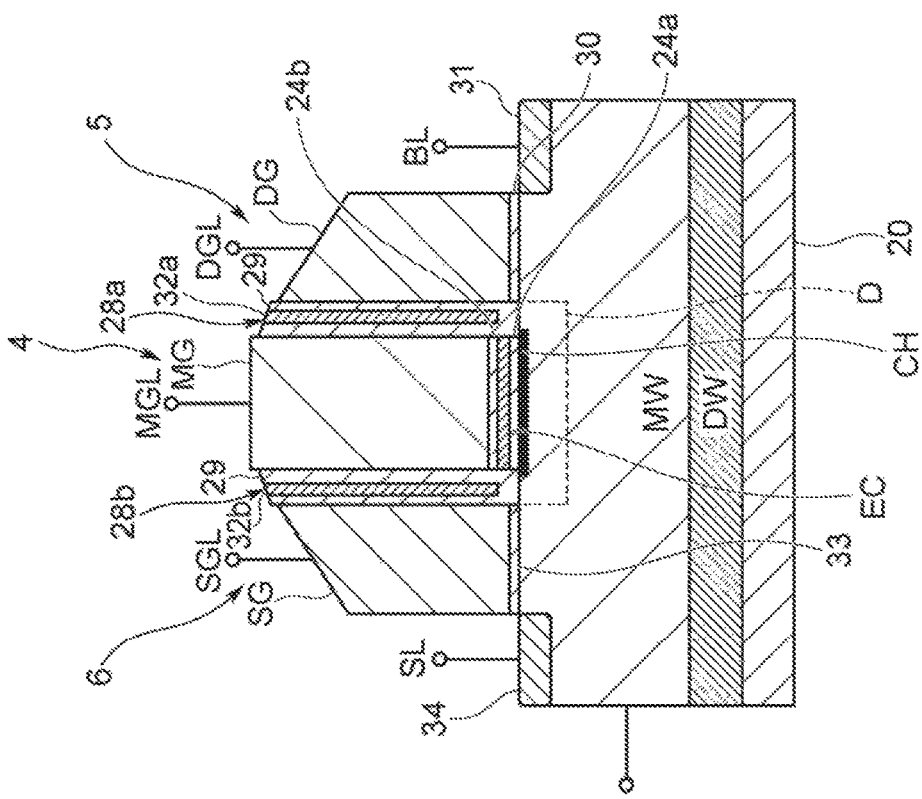
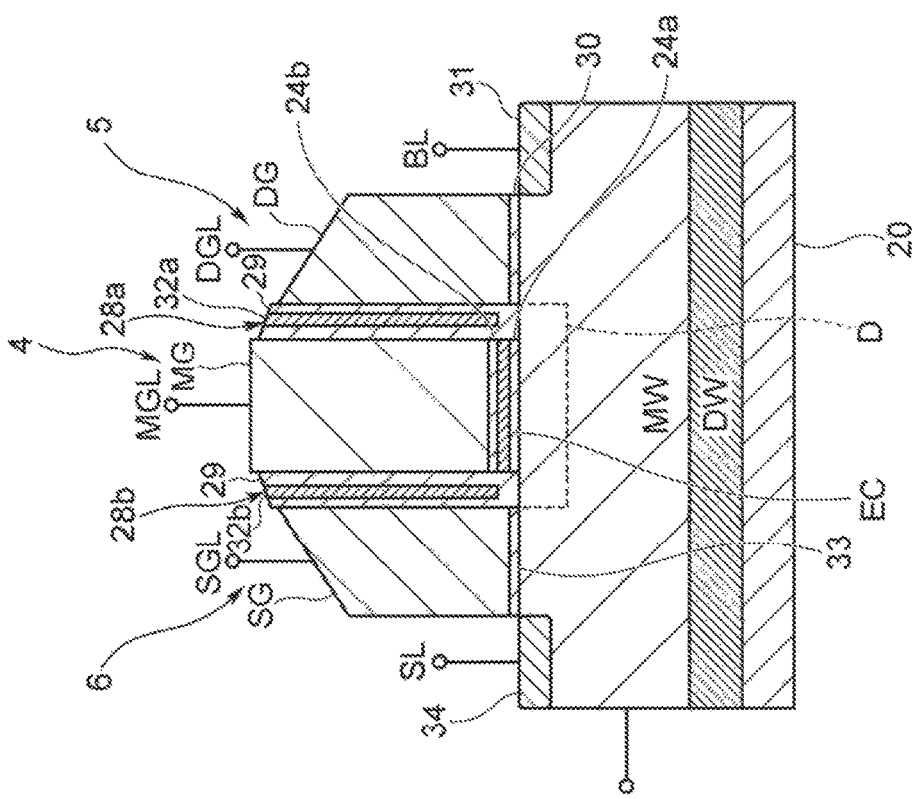

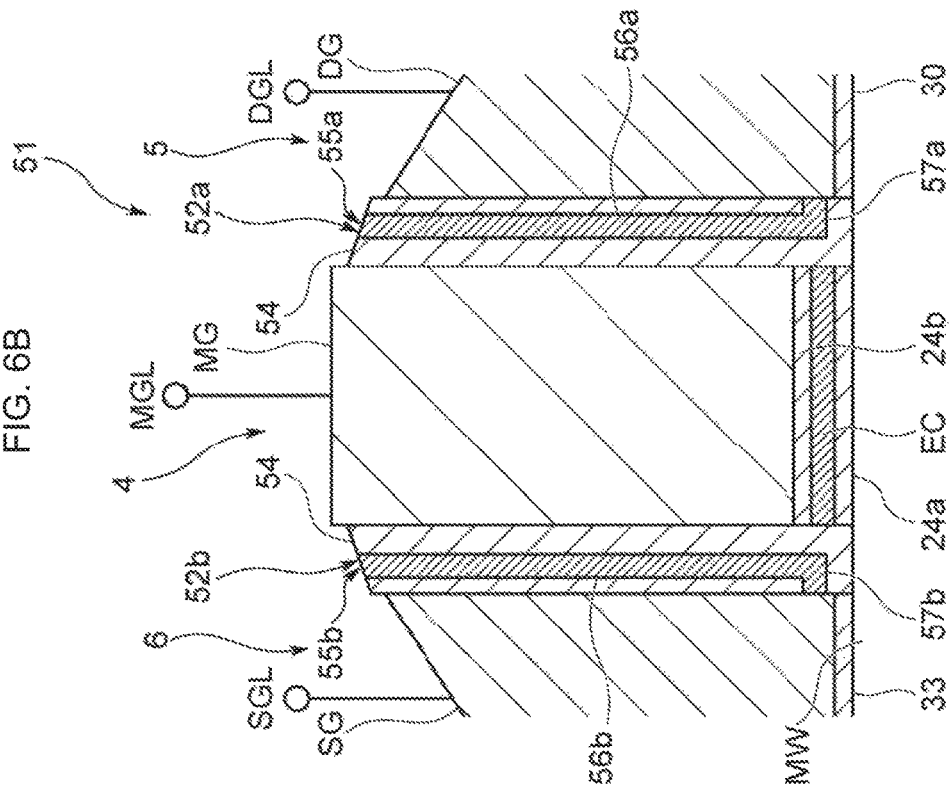
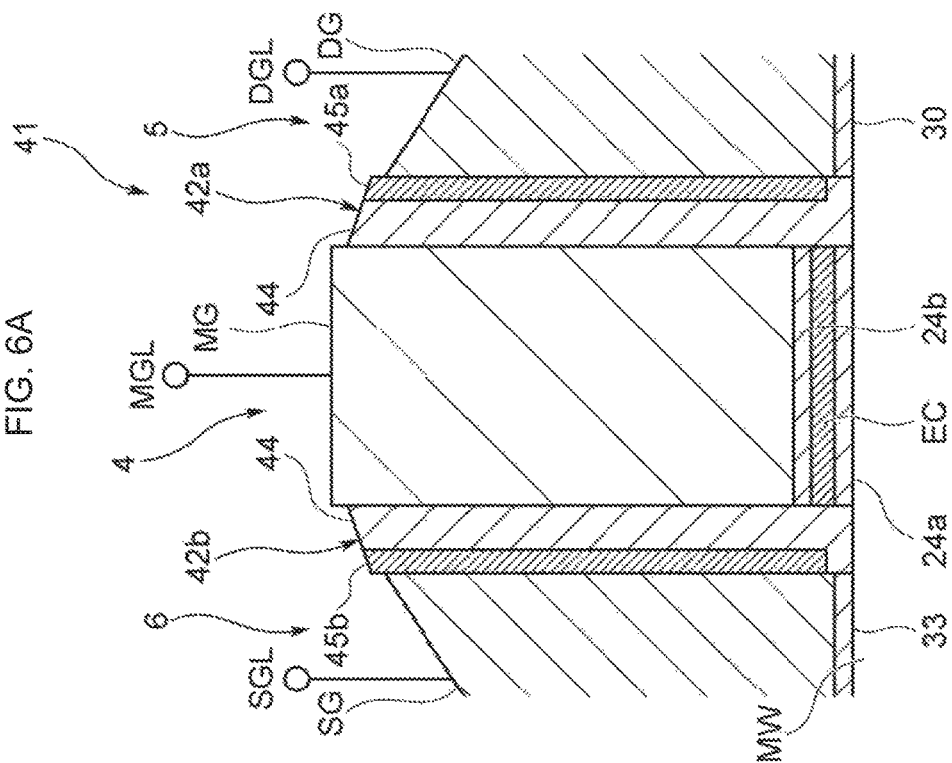

MEMORY CELL AND NON-VOLATILE SEMICONDUCTOR STORAGE DEVICE

TECHNICAL FIELD

The present invention relates to a memory cell and a non-volatile semiconductor memory device.

BACKGROUND ART

Japanese Patent Laid-open No. 2011-129816 (Patent Literature 1) discloses a conventional memory cell (refer to FIG. 15 in Patent Literature 1) in which a memory gate structure is disposed between two select gate structures. This memory cell includes a drain region connected to a bit line, and a source region connected to a source line. A first select gate structure, a memory gate structure, and a second select gate structure are disposed in this order over the memory gate well between the drain and source regions. In the memory cell with this configuration, the memory gate structure is provided with a charge storage layer. Data is programmed by injecting charge into the charge storage layer, and erased by removing charge from the charge storage layer.

In this memory cell, when charge is injected into the charge storage layer, a bit voltage from the bit line is applied through the first select gate structure to a channel layer below the memory gate structure while the second select gate structure connected to the source line blocks application of voltage. In this case, a high memory gate voltage is applied to a memory gate electrode of the memory gate structure, and charge is injected into the charge storage layer by a quantum tunneling effect due to a voltage difference between the bit voltage and the memory gate voltage.

CITATION LIST

Patent Literature

Patent Literature 1: Japanese Patent Laid-open No. 2011-129816

SUMMARY OF INVENTION

Technical Problem

However, in this memory cell, a high memory gate voltage may be applied to the memory gate electrode when charge is injected into the charge storage layer or when charge is prevented from being injected into the charge storage layer. For this reason, improvement has been required on a breakdown voltage around the memory gate electrode.

In addition, at charge injection into the charge storage layer in this memory cell, in a case where charge is stored in a region other than the charge storage layer directly below the memory gate electrode and the resistance increases at, for example, the memory well between the memory gate structure and each select gate structure due to influence of the charge, memory current decreases at a data reading operation, which causes an operation failure involving difficulties in improving reading performance and achieving high-speed operation.

The present invention has been made under such circumstances and aims at providing a memory cell and a non-volatile semiconductor memory device that improve a breakdown voltage around a memory gate electrode and prevent an operation failure due to storage of charge in a region other than a charge storage layer.

Solution to Problem

In order to solve the above-described problems, a memory cell according to the present invention includes: a drain region disposed on a memory well surface of a memory well and connected to a bit line; a source region disposed on the memory well surface and connected to a source line; a memory gate structure disposed between the drain region and the source region and including a lower memory gate insulating film, a charge storage layer, an upper memory gate insulating film, and a memory gate electrode stacked in this order over the memory well; a first select gate structure including a first select gate electrode disposed via a first select gate insulating film over the memory well between the drain region and the memory gate structure, the first select gate structure being disposed adjacent to a first sidewall of the memory gate structure via a first sidewall spacer; and a second select gate structure including a second select gate electrode disposed via a second select gate insulating film over the memory well between the source region and the memory gate structure, the second select gate structure being disposed adjacent to a second sidewall of the memory gate structure via a second sidewall spacer. Each of the first sidewall spacer and the second sidewall spacer includes sidewall layer disposed in an insulating layer. The sidewall layer is disposed along a sidewall of the memory gate structure and at a predetermined distance from the memory gate structure. The sidewall layer is made of an insulating material different from an insulating material of the insulating layer and is disposed apart from the charge storage layer and within the sidewall spacer. The distance between the memory well surface and a lower surface of the sidewall layer is greater than the thickness of the lower memory gate insulating film.

A non-volatile semiconductor memory device according to the present invention includes the memory cells disposed in a matrix of rows and columns. At least one bit line and at least one source line are connected to the memory cells. The memory cells are those described above.

Advantageous Effects of Invention

In the present invention, the nitride sidewall layers are respectively disposed in a first sidewall spacer and a second sidewall spacer, to separate a memory gate structure and a first select gate structure from each other and the memory gate structure and a second select gate structure from each other. This configuration improves breakdown voltages of the first sidewall spacer and the second sidewall spacer as compared with those of a case in which the first sidewall spacer and the second sidewall spacer are simply made from insulating oxide films. Correspondingly, breakdown voltage around a memory gate electrode is improved as compared with that of a conventional case.

In the present invention, the nitride sidewall layers are apart from a charge storage layer, and the distance between the surface of a memory well and each of lower surfaces of the nitride sidewall layers is greater than the thickness of the lower gate insulating film. With this configuration, charge is unlikely to be injected into the nitride sidewall layers at charge injection from the memory well into the charge storage layer, thereby preventing an operation failure due to storage of charge in a region other than the charge storage layer.

BRIEF DESCRIPTION OF DRAWINGS

FIG. 3A is a cross-sectional view illustrating prevention of charge injection into a charge storage layer when no channel layer is formed; and FIG. 3B is a cross-sectional view illustrating prevention of charge injection into the charge storage layer when the channel layer is formed.

FIG. 6A is a cross-sectional view illustrating a cross section (1) of a sidewall spacer according to an embodiment; and FIG. 6B is a cross-sectional view illustrating a cross section (2) of the sidewall spacer according to another embodiment.

DESCRIPTION OF EMBODIMENTS

Figure 1:
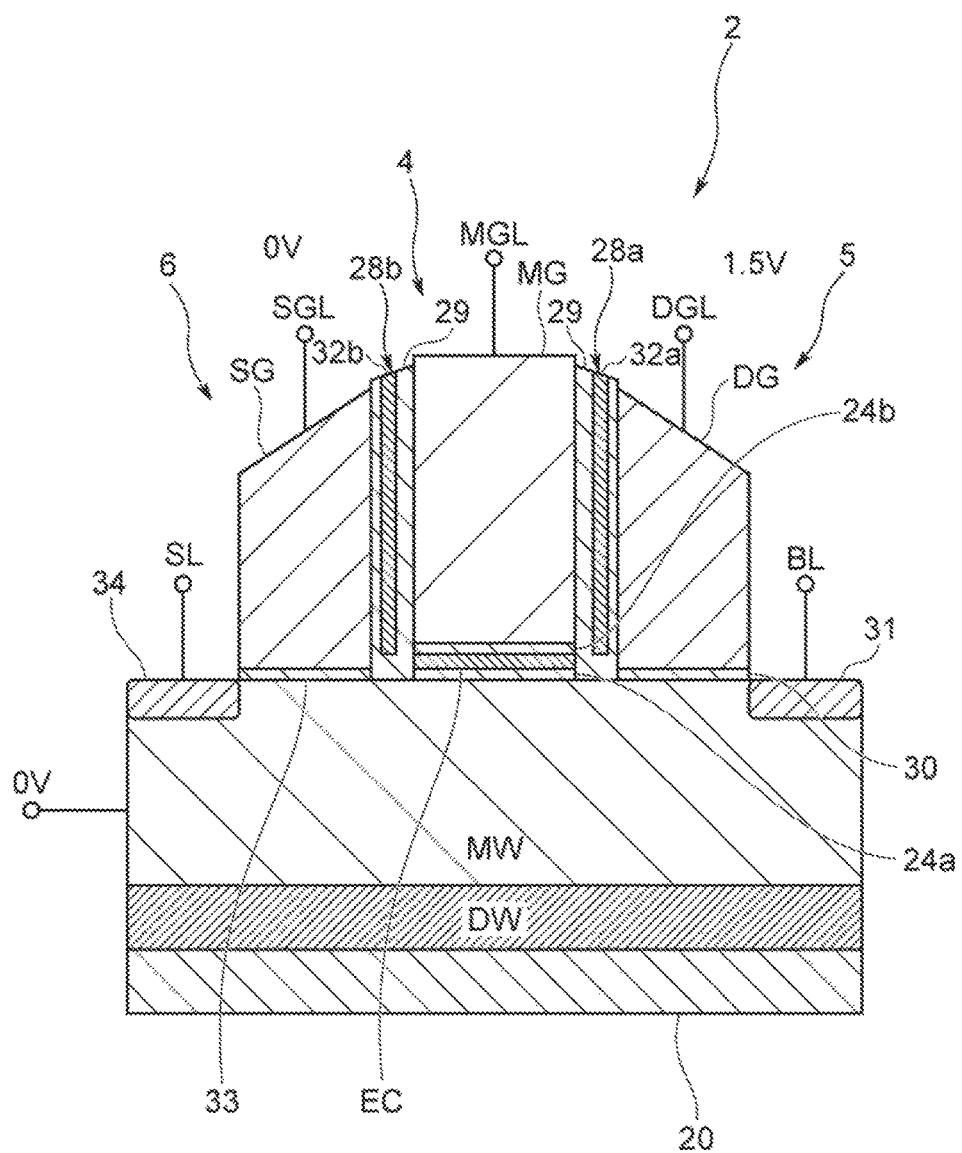
FIG. 1 is a cross-sectional view illustrating a cross section of a memory cell.

Hereinafter, embodiments of the present invention will be described in the following order.
1. Configuration of memory cell
2. Data programming method
2-1. First programming method
2-2. Second programming method
3. Other operations
4. Configurations of charge storage layer and nitride sidewall layer in memory cell according to the present invention
5. Operations and effects
6. Other embodiments (1) Configuration of Memory Cell A non-volatile semiconductor memory device includes memory cells according to the present invention. The memory cells each connected to a bit line and a source line are disposed in a matrix of rows and columns. Programming, reading, and erasing of data are performed on a desired memory cell through adjustment of the voltage values applied to the bit line and the source line or the like. The following description will be made mainly on a memory cell according to the present invention, without description of the entire configuration of the non-volatile semiconductor memory device.

In FIG. 1, a reference numeral 2 denotes a memory cell according to the present invention. In the memory cell 2, a P-type memory well MW is disposed via an N-type deep well layer DW over a substrate 20 containing P-type Si, for example. A memory gate structure 4, first select gate structure 5, and a second select gate structure 6 are disposed over the memory well MW. The memory gate structure 4 is included in an N-type transistor structure. The first select gate structure 5 is included in an N-type metal-oxide-semiconductor (MOS) transistor structure. The second select gate structure 6 is included in an N-type MOS transistor structure.

A drain region 31 and a source region 34 are spaced at a predetermined distance on the surface of the memory well MW. The drain region 31 is disposed at one end of the first select gate structure 5. The source region 34 is disposed at one end of the second select gate structure 6. The drain region 31 is connected to a bit line BL, and the source region 34 is connected to a source line SL. In this embodiment, impurity concentration is $1.0E21/cm^3$ or more in each of the drain region 31 and the source region 34. The impurity concentration is $1.0E19/cm^3$ or less, preferably is $3.0E18/cm^3$ or less in each surface region, which extends to the same depth as that of a surface region (for example, a region extending to a depth of 50 nm from the surface) directly below the memory gate structure 4 and in which a channel layer is to be formed, of the memory well MW directly below sidewall spacers 28a and 28b, which will be described below.

The memory gate structure 4 includes a charge storage layer EC disposed via a lower gate insulating film 24a over the memory well MW between the drain region 31 and the source region 34. The charge storage layer EC is made of, for example, silicon nitride ($Si_3N_4$), silicon oxynitride (SiON), alumina ($Al_2O_3$), or hafnia ($HfO_2$). The lower gate insulating film 24a is made of an insulating material such as $SiO_2$. The memory gate structure 4 also includes a memory gate electrode MG. The memory gate electrode MG is disposed over the charge storage layer EC, via an upper gate insulating film 24b, which is made of an insulating material. In the memory gate structure 4 with this configuration, the lower gate insulating film 24a and the upper gate insulating film 24b insulate the charge storage layer EC from the memory well MW and the memory gate electrode MG. The memory gate electrode MG is connected to a memory gate line MGL, through which a predetermined voltage is applied.

The memory gate structure 4 includes the first sidewall spacer 28a made of an insulating material such as $SiO_2$, and the first sidewall spacer 28a is disposed along a first sidewall of the memory gate structure 4. The memory gate structure 4 is adjacent to the first select gate structure 5 via the sidewall spacer 28a. The first sidewall spacer 28a, which is disposed between the memory gate structure 4 and the first select gate structure 5, has the predetermined thickness enough to insulate the memory gate structure 4 from the first select gate structure 5.

When the first sidewall spacer 28a has the width of less than 5 nm between the memory gate structure 4 and the first select gate structure 5, application of voltage to the memory gate electrode MG and a first select gate electrode DG may cause breakdown voltage failure in the sidewall spacer 28a. When the first sidewall spacer 28a disposed between the memory gate structure 4 and the first select gate structure 5 has the width exceeding 40 nm, resistance increases in a surface region (for example, a region extending to a depth of 50 nm from the surface) of the memory well MW between the memory gate electrode MG and the first select gate electrode DG. As a result, reading current is not likely to occur between the memory gate structure 4 and the first select gate structure 5 at data reading. For this reason, in the present embodiment, the sidewall spacer 28a between the memory gate structure 4 and the first select gate structure 5 desirably has the width between 5 nm and 40 nm inclusive.

The first sidewall spacer 28a has a configuration in which a nitride sidewall layer 32a made of SiN is disposed in an insulating layer 29 made of, for example, SiO$_2$. The nitride sidewall layer 32a having a wall shape is disposed along the sidewall of the memory gate structure 4 and at a predetermined distance from the memory gate structure 4, to separate the memory gate electrode MG from the first select gate electrode DG.

In the present embodiment, the nitride sidewall layer 32a has the predetermined thickness (for example, 5 to 20 nm) and is disposed along a sidewall of the first select gate structure 5 and at a predetermined distance from the first select gate structure 5. In the sidewall spacer 28a, the insulating layer 29 is disposed between the nitride sidewall layer 32a and the first select gate structure 5. The insulating layer 29, the nitride sidewall layer 32a, and the insulating layer 29 are disposed in this order in a direction from the memory gate structure 4 to the first select gate structure 5.

The first select gate structure 5 includes a first select gate insulating film 30 disposed on the memory well MW between the sidewall spacer 28a and the drain region 31. The first select gate insulating film 30 is made of an insulating material and has the thickness of less than or equal to 9 nm, preferably less than or equal to 3 nm. The first select gate electrode DG, to which a first select gate line DGL is connected, is disposed on the first select gate insulating film 30.

The memory gate structure 4 is provided with a sidewall spacer 28b made of an insulating material on a second sidewall thereof, and is adjacent to the second select gate structure 6 via the sidewall spacer 28b. The sidewall spacer 28b, which is disposed between the memory gate structure 4 and the second select gate structure 6, has the same thickness as that of the first sidewall spacer 28a, to insulate the memory gate structure 4 from the second select gate structure 6.

When the distance between the memory gate structure 4 and the second select gate structure 6 is less than 5 nm, application of voltage to the memory gate electrode MG and a second select gate electrode SG may cause a breakdown voltage failure in the sidewall spacer 28b. When the distance between the memory gate structure 4 and the second select gate structure 6 exceeds 40 nm, resistance increases in a surface region of the memory well MW between the memory gate electrode MG and the second select gate electrode SG. As a result, reading current is not likely to occur between the memory gate structure 4 and the second select gate structure 6 at data reading, which will be described below. For this reason, in the present embodiment, the sidewall spacer 28b between the memory gate structure 4 and the second select gate structure 6 desirably has the width between 5 nm and 40 nm inclusive.

The second sidewall spacer 28b has a configuration in which a nitride sidewall layer 32b made of SiN is disposed in the insulating layer 29 made of, for example, SiO$_2$. The nitride sidewall layer 32b having a wall shape is provided in a standing manner along a sidewall of the memory gate structure 4 and at a predetermined distance from the memory gate structure 4, to separate the memory gate electrode MG from the second select gate electrode SG.

In the present embodiment, the nitride sidewall layer 32b has the same thickness as that of the nitride sidewall layer 32a and is disposed along a sidewall of the second select gate structure 6 and at a predetermined distance from the second select gate structure 6. In the sidewall spacer 28b, the insulating layer 29 is disposed between the nitride sidewall layer 32b and the second select gate structure 6. Accordingly, the insulating layer 29, the nitride sidewall layer 32b, and the insulating layer 29 are disposed in this order in the direction from the memory gate structure 4 to the second select gate structure 6.

The second select gate structure 6 includes a second select gate insulating film 33 disposed on the memory well MW between the sidewall spacer 28b and the source region 34. The second select gate insulating film 33 is made of an insulating material and has the thickness of less than or equal to 9 nm, preferably less than or equal to 3 nm. The second select gate electrode SG, to which a second select gate line SGL is connected, is disposed on the second select gate insulating film 33.

In the present embodiment, the first select gate electrode DG and the second select gate electrode SG, which are disposed along the sidewalls of the memory gate electrode MG via the respective sidewall spacers 28a and 28b, each have a sidewall shape in which the height of the first select gate electrode DG or the second select gate electrode SG decreases with the distance from the memory gate electrode MG such that the top portion of the first select gate electrode DG or the second select gate electrode SG is sloped (angled) toward the memory well MW. In the above-described embodiment, the heights of a portion of the first select gate structure 5 and a portion of the second select gate structure 6 from the memory well MW are the same as the height of the memory gate structure 4. However, the present invention is not limited thereto, and the heights of the first select gate structure 5 and the second select gate structure 6 from the memory well MW may be any height less than or equal to the height of the memory gate structure 4.

Figure 2:
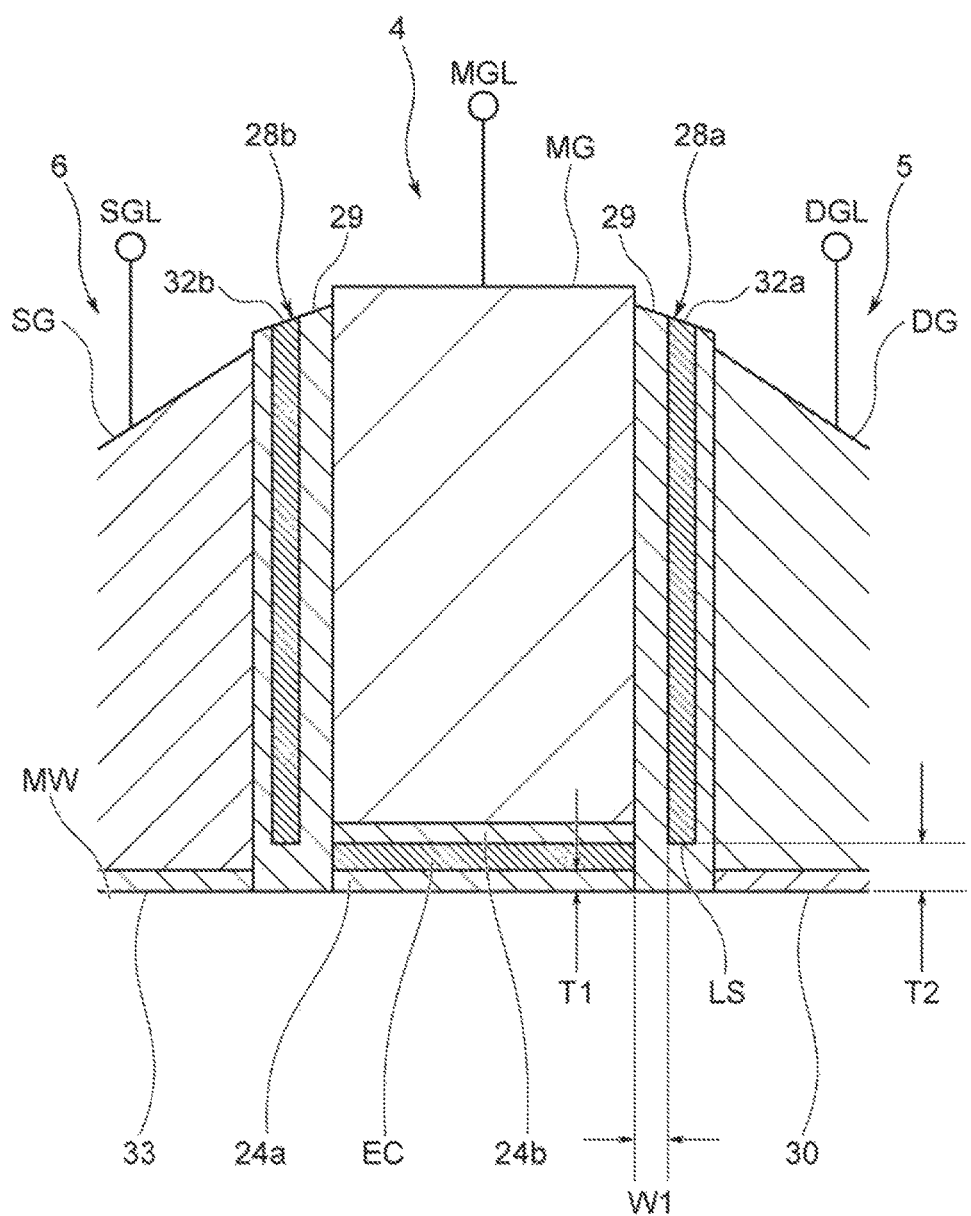
FIG. 2 is a schematic view illustrating the thickness T1 of a lower gate insulating film, the distance T2 between a memory well and a nitride sidewall layer, and the distance W1 between a memory gate structure and the nitride sidewall layer.

As illustrated in FIG. 2, in which any corresponding part to that in FIG. 1 is denoted by an identical reference numeral, the nitride sidewall layer 32a (32b) is disposed in the sidewall spacer 28a (28b) and at a predetermined distance W1 from the corresponding sidewall of the memory gate structure 4, such that each of the nitride sidewall layers 32a and 32b is apart from the charge storage layer EC of the memory gate structure 4. In this case, the distance W1 between the nitride sidewall layer 32a (32b) and the corresponding sidewall of the memory gate structure 4 is 3 nm or more, preferably 5 nm or more. When the distance W1 between the nitride sidewall layer 32a (32b) and the corresponding sidewall of the memory gate structure 4 is 3 nm or more, charge is prevented from flowing into the nitride sidewall layer 32a (32b) from the memory gate electrode MG at a programming operation or an erasing operation. When the distance W1 between the nitride sidewall layer 32a (32b) and the corresponding sidewall of the memory gate structure 4 is 5 nm or more, occurrences of short-circuit defects between the electrodes, which may be caused by an electric field applied between the first select gate electrode DG and the memory gate electrode MG or between the second select gate electrode SG and the memory gate electrode MG, may be reduced at a programming operation or a erasing operation.

As described above, the memory cell 2 includes the sidewall spacers 28a and 28b respectively having multilayer structures including the nitride sidewall layers 32a and 32b. The nitride sidewall layers 32a and 32b are each made of an insulating material different from that of the insulating layer 29. Hence, even when a current flows in the insulating layer 29 due to a poor film quality of the insulating layer 29, which is disposed along the sidewall of the memory gate structure 4, during an operation (data reprogramming operation) to reprogram data, the nitride sidewall layer 32a (32b) blocks the current flowing in the insulating layer 29. Accordingly, the occurrences of the short-circuit defects between the first select gate electrode DG and the memory gate electrode MG and between the second select gate electrode SG and the memory gate electrode MG are reduced.

In the above descriptions, the nitride sidewall layers 32a and 32b each made of a silicon nitride film or a silicon oxynitride film are used as the sidewall layers each including the insulating material. The present invention is not limited thereto. The sidewall layers each made of an insulating material (for example, hafnium) containing material other than silicon and oxygen may be disposed as the nitride sidewall layers 32a and 32b inside the respective sidewall spacers 28a and 28b. Even when the sidewall layers are made of various kinds of insulating materials having permittivity (dielectric constant) different from that of a silicon oxide film, the sidewall layers reduce the occurrences of short-circuit defects between the first select gate electrode DG and the memory gate electrode MG and between the second select gate electrode SG and the memory gate electrode MG, in a manner similar to the above.

The distance T2 between the surface of the memory well MW and a lower surface LS of the nitride sidewall layer 32a (32b) is greater than the thickness T1 of the lower gate insulating film 24a provided to the memory gate structure 4. Furthermore, the nitride sidewall layer 32a (32b) is disposed at a position farther from the memory well MW than the charge storage layer EC. Accordingly, charge injection into the nitride sidewall layer 32a (32b) is prevented when charge is injected from the channel layer of the memory well MW into the charge storage layer EC.

Even when charge is injected into the nitride sidewall layers 32a and 32b, the memory well MW between the memory gate electrode MG and the first select gate electrode DG, and the memory well MW between the memory gate electrode MG and the second select gate electrode SG are maintained in low resistance state(s) because the distance T2 between the surface of the memory well MW and each of the lower surfaces LS of the nitride sidewall layers 32a and 32b is greater than the thickness T1 of the lower gate insulating film 24a, and the nitride sidewall layers 32a and 32b are disposed farther from the memory well MW than the charge storage layer EC. Accordingly, the memory well MW between the memory gate electrode MG and the first select gate electrode DG and the memory well between the memory gate electrode MG and the second select gate electrode SG are maintained in low resistance state(s) and reduction in memory current is prevented at a data reading operation.

In the present embodiment, the distance T2 between the surface of the memory well MW and the lower surface LS of each of the nitride sidewall layers 32a and 32b is preferably 5 nm or more to prevent charge injection from the memory well MW into the nitride sidewall layers 32a and 32b, more preferably 10 nm or more to prevent reduction in reading current even when charge is injected into the nitride sidewall layers 32a and 32b.

Since the memory cell 2 having the above-described configuration is formed by a typical semiconductor production process by using, for example, a film forming technology such as a photolithography technique, oxidation, or CVD, or an etching technique, or an ion implantation technique, a description thereof will be omitted. In a method of producing the memory cell 2 including the sidewall spacers 28a and 28b, for example, after formation of the memory gate structure 4, a step of forming the insulating layers, a step of forming the nitride layers, a step of etching back, a step of forming the insulating layers, and a step of etching back are performed in this order. Thereby, the sidewall spacers 28a and 28b including the respective nitride sidewall layers 32a and 32b each sandwiched by the insulating layers 29 are formed.

In another method of producing the memory cell 2, for example, a layer-shaped conductive layer is formed over the memory well MW to cover the sidewall spacers 28a and 28b, which are disposed around the memory gate electrode MG, and then the conductive layer is etched back. Thereby, the sidewall-shaped first select gate electrode DG and the sidewall-shaped second select gate electrode SG are formed along the respective sidewall spacers 28a and 28b on sidewalls of the memory gate electrode MG.

Specifically, the memory gate electrode MG is formed before forming the first select gate electrode DG and the second select gate electrode SG. Then the sidewall-shaped first select gate electrode DG and the sidewall-shaped second select gate electrode SG are respectively formed over the sidewalls of the memory gate electrode MG, with the sidewall spacer 28a disposed between the sidewall and the first select gate electrode DG and the sidewall spacer 28b disposed between the sidewall and the second select gate electrode SG. In this manner, the first select gate electrode DG and the second select gate electrode SG are each formed from a conductive layer different from that of the memory gate electrode MG by a process performed after a semiconductor production process of forming the memory gate electrode MG.

(2) Data Programming Method

An operation (data programming operation) to program data into the memory cell 2 having the above-described configuration is performed by any one of a first programming method and a second programming method. In the first programming method, before execution of a data programming operation, carriers for forming a channel layer are removed from a region (hereinafter referred to as a channel layer formation carrier region), in which the carriers are present, in the memory well MW facing the memory gate electrode MG (hereinafter, this operation is referred to as carrier removing operation). In the second programming method, the data programming operation is executed without the carrier removing operation.

(2-1) First Programming Method

For example, in the first programming method, when the carrier removing operation is executed, a first select gate voltage of 1.5 V is applied to the first select gate electrode DG of the first select gate structure 5 illustrated in FIG. 1 through the first select gate line DGL, and a bit voltage of 0 V is applied to the drain region 31 through the bit line BL. Accordingly, the surface of the memory well MW facing the first select gate electrode DG of the first select gate structure 5 becomes a conductive state. Thus, the drain region 31 connected to the bit line BL is electrically connected to the channel layer formation carrier region of the memory well MW facing the memory gate structure 4.

In the present embodiment, for example, a second select gate voltage of 1.5 V is applied to the second select gate electrode SG of the second select gate structure 6 through the second select gate line SGL, and a source voltage of 0 V is applied to the source region 34 through the source line SL. Accordingly, the surface of the memory well MW facing the second select gate electrode SG of the second select gate structure 6 becomes a conductive state. Thus, the source region 34 connected to the source line SL is electrically connected to the channel layer formation carrier region of the memory well MW facing the memory gate structure 4.

In addition, in the memory cell 2, for example, a substrate voltage of 0 V the same as the bit voltage and the source voltage is applied to the memory well MW, and a carrier removal voltage of −2 V is applied to the memory gate electrode MG of the memory gate structure 4 through the memory gate line MGL. The carrier removal voltage applied to the memory gate electrode MG is determined on the basis of a threshold voltage (Vth) at which the channel layer is formed in the memory well MW facing the memory gate structure 4. In this case, the carrier removal voltage takes a voltage value outside the range of the threshold voltage (Vth), which differs between a data programming state and a data erasing state, and the carrier removal voltage is set at a voltage value which does not form a channel layer when applied to the memory gate electrode MG.

Hence, due to the carrier removal voltage applied to the memory gate electrode MG in the memory cell 2, carriers (electrons in this case) induced in the channel layer formation carrier region is conducted from the channel layer formation carrier region to the drain region 31 and/or the source region 34. Thus, the carriers are expelled from the channel layer formation carrier region. As a result, as illustrated in FIG. 3A, in which any corresponding part to that in FIG. 1 is denoted by an identical reference numeral, the memory well MW directly below the memory gate structure 4 in the memory cell 2 achieves a state in which no channel layer is formed and minor carriers are removed.

Even when the memory cell 2 is in a depletion state, carriers induced in the channel layer formation carrier region of the memory well MW directly below the memory gate structure 4 are removed from the channel layer formation carrier region by applying the carrier removal voltage lower than a lower threshold voltage, which is a voltage at the time no electrons are stored (or holes are stored) in the charge storage layer EC, to the memory gate electrode MG of the memory cell 2. Thereby the memory well MW directly below the memory gate structure 4 achieves the state in which no channel layer is formed and the minor carriers are removed.

Thereafter, a charge storage gate voltage of 12 V is applied to the memory gate electrode MG of the memory gate structure 4 through the memory gate line MGL, to inject charge into the charge storage layer EC of the memory cell 2. At this time, a gate off voltage of 0 V is applied to the second select gate electrode SG of the second select gate structure 6 through the second select gate line SGL, and a source off voltage of 0 V is applied to the source region 34 through the source line SL. The application of voltage blocks electrical connection between the source region 34, which is connected to the source line SL, and the channel layer formation carrier region below the memory gate structure 4. Accordingly, voltage is prevented from being applied to the channel layer formation carrier region below the memory gate structure 4 through the source line SL.

The first select gate voltage of 1.5 V is applied to the first select gate electrode DG of the first select gate structure 5 through the first select gate line DGL, and a charge storage bit voltage of 0 V is applied to the drain region 31 through the bit line BL. The application of voltage achieves electrical connection between the drain region 31, which is connected to the bit line BL, and the channel layer formation carrier region below the memory gate structure 4. At this time, the substrate voltage of 0 V the same as the charge storage bit voltage is applied to the memory well MW.

In the memory gate structure 4, carriers are induced in the channel layer formation carrier region by the electrical connection between the channel layer formation carrier region of the memory well MW and the drain region 31. The carriers form the channel layer having 0 V, which is the same as the charge storage bit voltage, in the surface of the memory well MW. As a result, in the memory gate structure 4, a large voltage difference of 12 V is generated between the memory gate electrode MG and the channel layer, causing a quantum tunneling effect. Thereby charge is injected into the charge storage layer EC. Thus a state in which data has been programmed is achieved.

To avoid charge injection into the charge storage layer EC of the memory cell 2 when a high charge storage gate voltage is applied to the memory gate electrode MG, a high bit voltage does not need to be applied to the bit line BL in accordance with the high charge storage gate voltage, unlike a conventional case. The first select gate structure 5 blocks the electrical connection between the bit line BL and the channel layer formation carrier region of the memory well MW directly below the memory gate structure 4, and the second select gate structure 6 blocks the electrical connection between the source line SL and the channel layer formation carrier region directly below the memory gate structure 4. Thereby, charge is prevented from being injected into the charge storage layer EC of the memory gate structure 4.

When no data is to be programmed into the memory cell 2, for example, the first select gate voltage of 1.5 V is applied to the first select gate electrode DG through the first select gate line DGL, and an off voltage of 1.5 V is applied to the drain region 31 through the bit line BL. Accordingly, the first select gate structure 5 becomes a non-conductive state (off state). As a result, in the memory cell 2, the electrical connection between the drain region 31, which is connected to the bit line BL, and the channel layer formation carrier region of the memory well MW directly below the memory gate structure 4, is blocked.

In the memory cell 2 into which no data is to be programmed, for example, the gate off voltage of 0 V is applied to the second select gate electrode SG through the second select gate line SGL, and the source off voltage of 0 V is applied to the source region 34 through the source line SL. Accordingly, the second select gate structure 6 becomes a non-conductive state (off state). As a result, in the memory cell 2, the electrical connection between the source region 34, which is connected to the source line SL, and the channel layer formation carrier region of the memory well MW directly below the memory gate structure 4, is blocked. The substrate voltage of 0 V the same as the charge storage bit voltage is applied to the memory well MW.

At this time, carriers are removed from the channel layer formation carrier region, which is disposed below the memory gate structure 4 of the memory cell 2, in advance by carrier removing operation, so that the channel layer formation carrier region is in a state where no carriers are present. In this state, the memory well MW directly below the first select gate structure 5 and the memory well MW directly below the second select gate structure 6 are in a non-conductive state. Hence, a depletion layer D, in which no charge is present, is formed in the memory well MW directly below the memory gate structure 4.

With this configuration, in the memory cell 2 into which no data is to be programmed, voltage drops at the three-layer configuration of the upper gate insulating film 24b, the charge storage layer EC, and the lower gate insulating film 24a. Accordingly, a voltage difference is generated between the memory gate electrode MG and the surface of the memory well MW. In addition, the voltage drops in the depletion layer D formed to a predetermined depth from the surface of the memory well MW, and eventually reaches the substrate voltage of 0 V.

In the present embodiment, when the charge storage gate voltage of 12 V is applied to the memory gate electrode MG in the memory gate structure 4 of the memory cell 2, the voltage difference between the memory gate electrode MG and the surface of the memory well MW is approximately 3.5 V (for example, given that a flat band voltage Vfb is 0 V, a memory gate voltage Vg is 12 V, the memory well MW has an acceptor concentration Na of $2.0E17$ cm$^{-3}$, the upper gate insulating film 24b has the thickness of 2 nm, the charge storage layer EC has the thickness of 12 nm, and the lower gate insulating film has the thickness of 2 nm). The voltage difference is not large enough to cause the quantum tunneling effect between the memory gate electrode MG and the surface of the memory well MW, thereby preventing charge injection into the charge storage layer EC.

In the memory cell 2, no impurity diffusion region, which has a high impurity concentration, is formed in a region of the memory well MW between the memory gate structure 4 and the first select gate structure 5. Thus, the depletion layer D is reliably formed in the memory well MW between the memory gate structure 4 and the first select gate structure 5. The depletion layer D prevents application of potential from the surface of the memory well MW directly below the memory gate structure 4 to the first select gate insulating film 30, thereby preventing dielectric breakdown of the first select gate insulating film 30 due to the potential at the surface of the memory well MW.

No impurity diffusion region, which has a high impurity concentration, is formed in a region of the memory well MW between the memory gate structure 4 and the second select gate structure 6. Thus, the depletion layer D is reliably formed in the memory well NW between the memory gate structure 4 and the second select gate structure 6. The depletion layer D prevents application of potential from the surface of the memory well MW directly below the memory gate structure 4 to the second select gate insulating film 33, thereby preventing dielectric breakdown of the second select gate insulating film 33 due to the potential at the surface of the memory well MW.

In the carrier removing operation described above, for example, the second select gate structure 6 may block the electrical connection between the channel layer formation carrier region and the source region 34, to transfer carriers from the channel layer formation carrier region to the drain region 31 only. Alternatively, the first select gate structure 5 may block the electrical connection between the channel layer formation carrier region and the drain region 31, to transfer charge from the channel layer formation carrier region to the source region 34 only. In this manner, carriers are removed from the channel layer formation carrier region to form the depletion layer D.

(2-2) Second Programming Method

The second programming method is the same as "(2-1) first programming method" described above, except that the second programming method does not perform carrier removing operation when data is programmed into the memory cell 2, and hence description of data programming is omitted. To prevent charge injection into the charge storage layer EC of the memory cell 2 when a high charge storage gate voltage is applied to the memory gate electrode MG, the charge storage gate voltage of 12 V is applied to the memory gate electrode MG through the memory gate line MGL. Thus, the charge storage gate voltage is applied to the memory well MW. Accordingly, as illustrated in FIG. 3B, in which any corresponding part to that in FIG. 1 is denoted by an identical reference numeral, a channel layer CH is formed along the surface of the memory well MW facing the memory gate electrode MG in the memory cell 2.

In the second select gate structure 6 of the memory cell 2, for example, the gate off voltage of 0 V is applied to the second select gate electrode SG through the second select gate line SGL, and the source off voltage of 0 V is applied to the source region 34 through the source line SL. Accordingly, the memory well MW facing the second select gate electrode SG is in a non-conductive state. Thereby electrical connection between the source region 34, which is connected to the source line SL, and the channel layer CH below the memory gate structure 4 is blocked.

In the first select gate structure 5 of the memory cell 2, for example, the first select gate voltage of 1.5 V is applied to the first select gate electrode DG through the first select gate line DGL, and the off voltage of 1.5 V is applied to the drain region 31 through the bit line BL. Accordingly, the memory well MW facing the first select gate electrode DG of the first select gate structure 5 becomes a non-conductive state. Thereby, electrical connection between the drain region 31, which is connected to the bit line BL, and the channel layer CH below the memory gate structure 4 is blocked.

At this time, the memory well MW below the first select gate structure 5 and the memory well MW below the second select gate structure 6 are in a non-conductive state. The first select gate structure 5 and the second select gate structure 6 are disposed over respective sides of the memory gate structure 4 of the memory cell 2. This non-conductive state blocks the electrical connection from each of the drain region 31 and the source region 34 to the channel layer CH, which is formed at the surface of the memory well MW by the memory gate electrode MG. Accordingly, the depletion layer D is formed around the channel layer CH.

A capacitor (gate-insulator capacitor) is achieved by a three-layer configuration of the upper gate insulating film 24b, the charge storage layer EC, and the lower gate insulating film 24a. Another capacitor (depletion-layer capacitor) is achieved by the depletion layer D formed in the memory well MW and surrounding the channel layer CH. The gate-insulator capacitor and the depletion-layer capacitor are connected in series. For example, when the gate-insulator capacitor has a capacitance three times as large as that of the depletion-layer capacitor, the channel layer CH has a channel potential of 9 V.

Thus, when the charge storage gate voltage of 12 V is applied to the memory gate electrode MG in the memory gate structure 4, the channel layer CH surrounded by the depletion layer D in the memory well MW has a channel potential of 9 V. Accordingly, the memory gate electrode MG and the channel layer CH have a small voltage difference of 3 V therebetween. As a result, the quantum tunneling effect does not occur, and thus charge is prevented from being injected into the charge storage layer EC.

When the above-described operation is executed in the memory cell 2, the channel potential at the start of the operation may vary depending on a state of charge storage in the memory cell 2. Hence, before the data programming operation, it is more desirable to additionally perform an operation to set the channel potential of the memory cell 2 the same as the potential of the bit line BL or the source line SL. In this operation, the potential of the bit line BL or the source line SL is set to, for example, 0 V, the potential of the first select gate electrode DG or the second select gate electrode SG is set to, for example, 1.5 V, and the memory gate electrode MG is set to, for example, 1.5 V. In this case, after the setting of the channel potential of the memory cell 2, the gate off voltage applied to the first select gate electrode DG or the second select gate electrode SG is set back to 0 V. Then, the programming operation may be performed.

(3) Other Operations

In a reading operation, the bit line BL, which is connected to the memory cell 2 from which data is to be read, is charged to, for example, 1.5 V in advance. Then, a change in the potential of the bit line BL is detected based on whether a current flows through the memory cell 2 when the source line SL is set to 0 V. In this manner, whether charge is stored in the charge storage layer EC is determined. Specifically, when charge has been stored in the charge storage layer EC of the memory gate structure 4 (when data has been programmed) at data reading, the memory well MW directly below the memory gate structure 4 is in a non-conductive state. Hence the electrical connection between the drain region 31 and the source region 34 is blocked. Accordingly, in the memory cell 2 from which data is to be read, a reading voltage of 1.5 V applied to the bit line BL, which is connected to the drain region 31 adjacent to the first select gate structure 5, is maintained.

When no charge has been stored in the charge storage layer EC of the memory gate structure 4 (when no data has been programmed) at data reading, the memory well MW directly below the memory gate structure 4 is in a conductive state so that the drain region 31 and the source region 34 are electrically connected to each other. As a result, the source line SL, to which 0 V is applied, and the bit line BL, to which 1.5 V is applied, are electrically connected to each other through the memory cell 2. Accordingly, in the memory cell 2 from which data is to be read, the reading voltage of the bit line BL is applied to the source line SL, to which 0 V is applied, and thereby the reading voltage of 1.5 V applied to the bit line BL drops. Therefore, in a non-volatile semiconductor memory device in which a plurality of the memory cells 2 are arranged, data indicating whether charge is stored in the charge storage layer EC of the memory cell 2 is read by detecting whether the reading voltage of the bit line BL has changed.

In a data erasing operation to remove charge from the charge storage layer EC of the memory cell 2, a memory gate voltage of −12 V is applied to the memory gate electrode MG through the memory gate line MGL. Accordingly, charge is removed from the charge storage layer EC to the memory well MW to which 0 V is applied. Thus, data is erased.

Figure 4A:
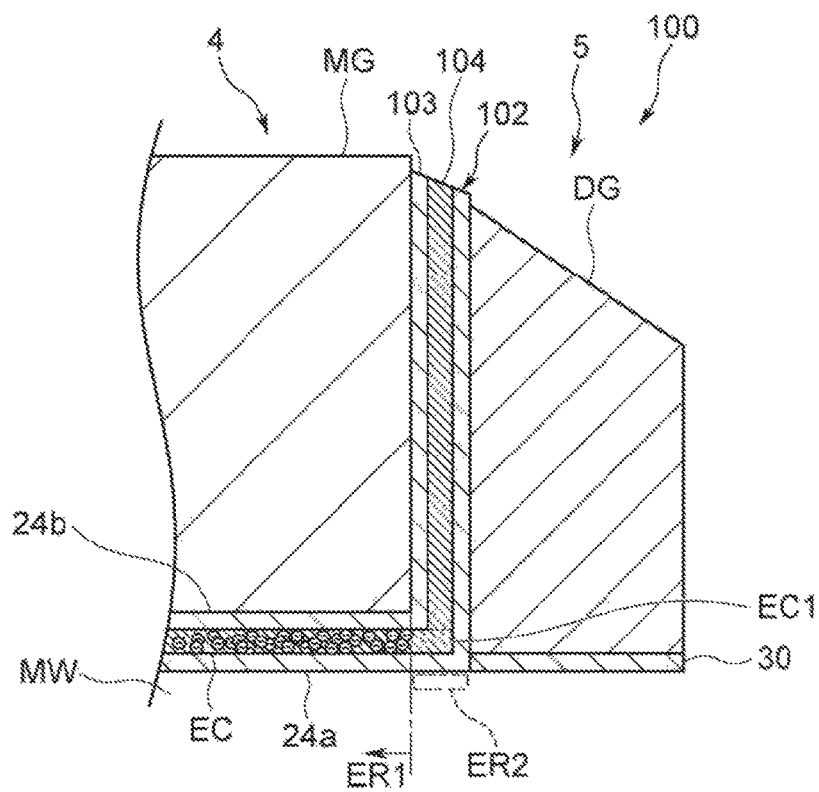
FIG. 4A is a schematic view illustrating a state immediately after charge injection into a charge storage layer in a memory cell according to Comparative Example 1, in which a nitride sidewall layer in a sidewall spacer between a memory gate electrode and a first select gate electrode communicates with the charge storage layer.

(4) Configurations of Charge Storage Layer and Nitride Sidewall Layer in Memory Cell According to the Present Invention FIG. 4A, in which any corresponding part to that in FIG. 1 is denoted by an identical reference numeral, illustrates a memory cell 100 according to Comparative Example 1. The memory cell 100 differs from the memory cell 2 according to the present invention illustrated in FIG. 1 in that the memory cell 100 includes a charge storage layer EC1 disposed in a sidewall spacer 102 between the memory gate electrode MG and the first select gate electrode DG. FIG. 4A only illustrates the sidewall spacer 102 between the memory gate electrode MG and the first select gate electrode DG. However, the charge storage layer EC1 is also disposed in a sidewall spacer between the memory gate electrode MG and the second select gate electrode SG (not illustrated in FIG. 4A).

In the memory cell 100 illustrated as Comparative Example 1, the charge storage layer EC1 provided in the sidewall spacer 102 has one end integrally formed with an end of the charge storage layer EC provided in a region ER1 below the memory gate electrode MG. Similar to the charge storage layer EC directly below the memory gate structure 4, the charge storage layer EC1 extends along the surface of the memory well MW to a predetermined position in the sidewall spacer 102 between the memory gate electrode MG and the first select gate electrode DG. A nitride sidewall layer 104 having a wall shape is provided in a standing manner at the other end of the charge storage layer EC1.

The nitride sidewall layer 104 according to Comparative Example 1 has a lower end integrally formed with the charge storage layer EC1 in the sidewall spacer 102, and extends upward along the respective sidewalls of the memory gate electrode MG and the first select gate electrode DG. The nitride sidewall layer 104 is disposed at a predetermined distance from the first select gate structure 5, and thus is not in contact with the first select gate structure 5.

As illustrated in FIG. 4A, in the memory cell 100 according to Comparative Example 1, in which the charge storage layers EC and EC1 and the nitride sidewall layer 104 are integrally formed, charge is injected from the memory well MW into the charge storage layer EC due to the quantum tunneling effect caused by a voltage difference between the memory gate electrode MG and the channel layer formed in the surface of the memory well MW (not illustrated). However, in the memory cell 100 according to Comparative Example 1, the distance between the memory well MW and the charge storage layer EC1 in the sidewall spacer 102 is the same as the distance between the memory well MW and the charge storage layer EC directly below the memory gate electrode MG. Hence, when charge is injected from the memory well MW into the charge storage layer EC, charge may be injected also into the charge storage layer EC1 in the sidewall spacer 102.

Figure 4B:
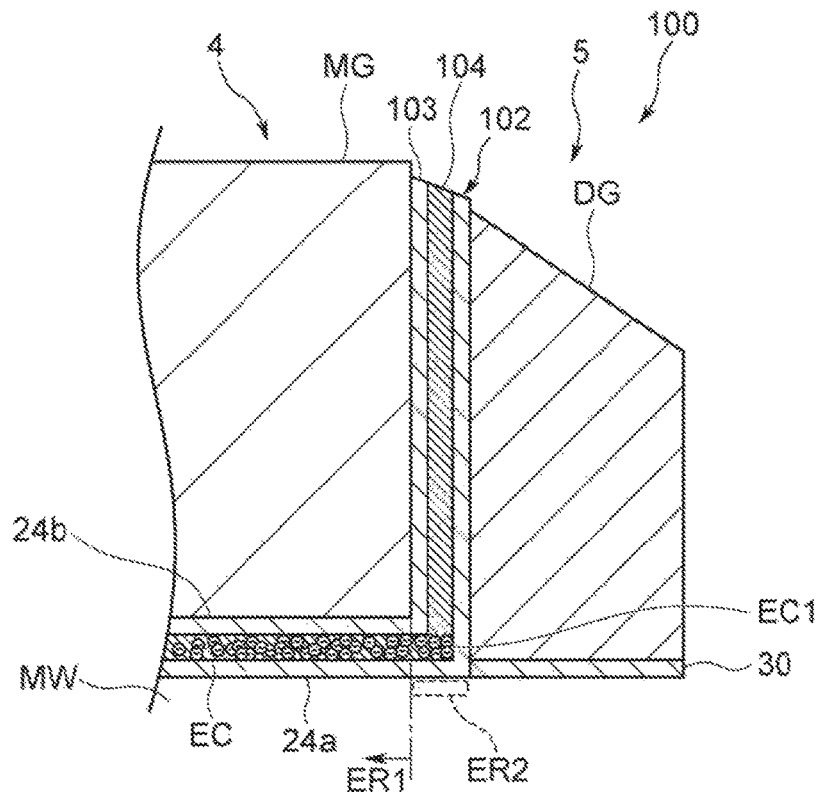
FIG. 4B is a schematic view illustrating a state in which charge in the charge storage layer diffuses into the nitride sidewall layer with time after the charge injection into the charge storage layer illustrated in FIG. 4A.

As illustrated in FIG. 4B, in which any corresponding part to that in FIG. 4A is denoted by an identical reference numeral, for example, when the memory cell 100 according to Comparative Example 1 is left at a high temperature, charge in the charge storage layer EC gradually diffuses into the charge storage layer EC1, which is disposed in the sidewall spacer 102 between the memory gate electrode MG and the first select gate electrode DG, as time elapses. Accordingly, in the memory cell 100 according to Comparative Example 1, charge may be stored not only in the charge storage layer EC but also in the charge storage layer EC1 directly above a region ER2 of the memory well MW between the memory gate electrode MG and the first select gate electrode DG, and also in the nitride sidewall layer 104.

As described above, in the memory cell 100 according to Comparative Example 1, charge is likely to be stored in the charge storage layer EC1 directly above the region ER2 of the memory well MW between the memory gate electrode MG and the first select gate electrode DG, and also in the nitride sidewall layer 104. When a large amount of charge is thus stored or once charge is stored in the charge storage layer EC1 and the nitride sidewall layer 104, the stored charge has a charge centroid close to the substrate due to the small thickness of the sidewall spacer 102 below the charge storage layer EC1. As a result, in the memory cell 100 according to Comparative Example 1, a resistance increases in the region ER2 of the memory well MW between the memory gate electrode MG and the first select gate electrode DG, resulting in reduction in a memory current in a reading operation. Thus, it is difficult to improve reading performance and achieve high speed operation.

Figure 5:
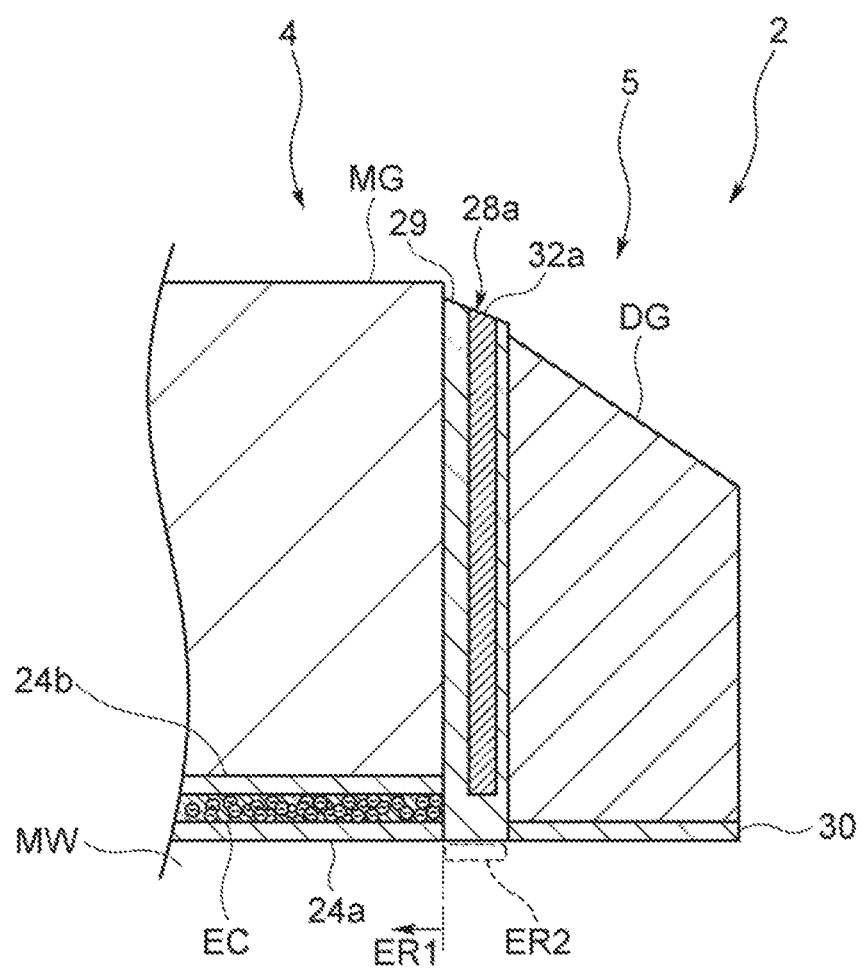
FIG. 5 is a schematic view illustrating a state in which charge is injected into a charge storage layer in a memory cell according to the present invention.

In the memory cell 2 according to the present invention, as illustrated in FIG. 5, in which any corresponding part to that in FIG. 1 is denoted by an identical reference numeral, the charge storage layer EC is provided only in the region ER1, in which the memory gate electrode MG faces the memory well MW. The nitride sidewall layer 32a in the sidewall spacer 28a is apart from the charge storage layer EC, and the nitride sidewall layer 32a is disposed farther from the memory well MW than the charge storage layer EC.

With this configuration, in the memory cell 2, charge is prevented from being injected into the nitride sidewall layer 32a when charge is injected into the charge storage layer EC. Even after a predetermined time after the charge injection into the charge storage layer EC, the charge does not migrate from the charge storage layer EC into the sidewall spacers 28a and 28b. Accordingly, the charge is maintained only in the charge storage layer EC in the region ER1 below the memory gate electrode MG.

As a result, in the memory cell 2, charge is prevented from being stored in a region directly above the region ER2 of the memory well MW between the memory gate electrode MG and the first select gate electrode DG. Even when charge is stored in the nitride sidewall layer 32a in the sidewall spacer 28a, the stored charge has a charge centroid far from the substrate. Accordingly, the resistance is maintained low in the region ER2 of the memory well MW between the memory gate electrode MG and the first select gate electrode DG (the second select gate electrode SG), and thereby reading performance is improved and high speed operation is achieved.

(5) Operations and Effects

In the above-described configuration, the memory cell 2 according to the present invention includes: the memory gate structure 4 including the lower gate insulating film 24a, the charge storage layer EC, the upper gate insulating film 24b, and the memory gate electrode MG stacked in this order over the memory well MW between the drain region 31 and the source region 34; the sidewall-shaped first select gate structure 5 disposed over the first sidewall of the memory gate structure 4 via the sidewall spacer 28a; and the sidewall-shaped second select gate structure 6 disposed over the second sidewall of the memory gate structure 4 via the sidewall spacer 28b.

The first select gate structure 5 includes the sidewall-shaped first select gate electrode DG disposed on the first select gate insulating film 30 disposed over the memory well MW between the drain region 31 connected to the bit line BL and the first sidewall spacer 28a provided on the sidewall of the memory gate structure 4. The second select gate structure 6 includes the sidewall-shaped second select gate electrode SG disposed on the second select gate insulating film 33 disposed over the memory well MW between the source region 34 connected to the source line SL and the second sidewall spacer 28b provided on the sidewall of the memory gate structure 4.

As described above, in the memory cell 2 according to the present invention, the first select gate electrode DG and the second select gate electrode SG are formed in sidewall shapes along the sidewalls of the memory gate structure 4. Hence, the memory gate structure 4 does not extend over the first select gate electrode DG and the second select gate electrode SG. Thus, the memory gate structure 4 is flush with a portion of the first select gate structure 5 and a portion of the second select gate structure 6. Accordingly, the memory gate structure 4 does not protrude from the first select gate electrode DG and the second select gate electrode SG, so that the gate of the memory cell 2 and a gate of a peripheral circuit having a MOS transistor structure other than the memory cell 2 have equal gate heights. This configuration facilitates flat wiring in a production process.

The memory cell 2 according to the present invention includes the nitride sidewall layer 32a and the nitride sidewall layer 32b. The nitride sidewall layer 32a is disposed in the first sidewall spacer 28a between the memory gate structure 4 and the first select gate structure 5. The nitride sidewall layer 32a is disposed at the distance W1 from the memory gate structure 4 and extends along the corresponding sidewall of the memory gate structure 4. The nitride sidewall layer 32b is disposed in the second sidewall spacer 28b between the memory gate structure 4 and the second select gate structure 6. The nitride sidewall layer 32b is disposed at the distance W1 from the memory gate structure 4 and extends along the corresponding sidewall of the memory gate structure 4.

As described above, in the memory cell 2, the nitride sidewall layer 32a is disposed in the first sidewall spacer 28a to separate the memory gate structure 4 from the first select gate structure 5, and the nitride sidewall layer 32b is disposed in the second sidewall spacer 28b to separate the memory gate structure 4 from the second select gate structure 6. This configuration improves breakdown voltages of the first sidewall spacer 28a and the second sidewall spacer 28b as compared with those of a case in which the first sidewall spacer 28a and the second sidewall spacer 28b are simply made of insulating oxide films. Accordingly, a breakdown voltage around the memory gate electrode MG is improved as compared with that of a conventional case.

In the memory cell 2, the nitride sidewall layer 32a (32b) is apart from the charge storage layer EC provided to the memory gate structure 4. In addition, the distance T2 between the surface of the memory well MW and the lower surface LS of the nitride sidewall layer 32a (32b) is greater than the thickness T1 of the lower gate insulating film 24a provided to the memory gate structure 4. Accordingly, the nitride sidewall layer 32a (32b) is disposed farther from the memory well MW than the charge storage layer EC. With this configuration, charge is not likely to be injected into the nitride sidewall layer 32a (32b) at charge injection from the memory well MW into the charge storage layer EC. Thereby, an operation failure due to storage of charge in regions other than the charge storage layer EC is prevented.

In the memory cell 2, the first sidewall spacer 28a and the second sidewall spacer 28b as well as the positions of the nitride sidewall layers 32a and 32b are symmetrically disposed with respect to the memory gate structure 4. This configuration facilitates the formation of the nitride sidewall layers 32a and 32b at predetermined positions in the first sidewall spacer 28a and the second sidewall spacer 28b, without a complicated production process.

In the memory cell 2, to prevent charge injection into the charge storage layer EC by using the first programming method when the charge storage gate voltage needed to inject charge into the charge storage layer EC is applied to the memory gate electrode MG, the first select gate structure 5 blocks the electrical connection between the drain region 31 and the region of the memory well MW facing the memory gate electrode MG and the second select gate structure 6 blocks the electrical connection between the source region 34 and the region of the memory well MW facing the memory gate electrode MG, in a state that carriers induced in the channel layer formation carrier region of the memory well MW facing the memory gate electrode MG are removed from the channel layer formation carrier region.

As a result, the channel layer formation carrier region (FIG. 3A) in the memory cell 2 is in a state in which the depletion layer D is formed, without the channel layer, in the channel layer formation carrier region. The potential at the surface of the memory well MW increases in accordance with the charge storage gate voltage, to reduce the voltage difference between the memory gate electrode MG and the surface of the memory well MW. Thereby charge injection into the charge storage layer EC is prevented. In addition, the depletion layer D prevents the potential at the surface of the memory well MW directly below the memory gate structure 4 from being applied to the first select gate insulating film 30 and the second select gate insulating film 33.

Thus, in the memory cell 2, the voltage values applied to the bit line BL and the source line SL are reduced irrespective of a high charge storage gate voltage needed to inject charge into the charge storage layer EC by the quantum tunneling effect. The voltage values applied to the bit line BL and the source line SL are reduced to a voltage value required for the first select gate structure 5 to block the electrical connection between the bit line BL and the region of the memory well MW facing the memory gate electrode MG and a voltage value required for the second select gate structure 6 to block the electrical connection between the source line SL and the region of the memory well MW facing the memory gate electrode MG. In accordance with the reduction in the voltages applied to the bit line BL and the source line SL in the memory cell 2, the thickness of the first select gate insulating film 30 of the first select gate structure 5 and the thickness of the second select gate insulating film 33 of the second select gate structure 6 are reduced. Thereby, high-speed operation is achieved correspondingly.

In a case where the second programming method is employed to prevent charge injection into the charge storage layer EC in the memory cell 2, the first select gate structure 5 blocks the electrical connection between the drain region 31 and the channel layer CH and the second select gate structure 6 blocks the electrical connection between the source region 34 and the channel layer CH even when the charge storage gate voltage needed to inject charge into the charge storage layer EC is applied to the memory gate electrode MG and the channel layer CH is formed at the surface of the memory well MW facing the memory gate electrode MG (FIG. 3B).

Thus, in the memory cell 2, the depletion layer D is formed around the channel layer CH of the memory well MW facing the memory gate structure 4, and the channel potential of the channel layer CH increases in accordance with the charge storage gate voltage. Accordingly, the voltage difference between the memory gate electrode MG and the channel layer CH is reduced. Thus, the depletion layer D blocks application of voltage from the channel layer CH to the first select gate insulating film 30 and to the second select gate insulating film 33 while charge injection into the charge storage layer EC is prevented.

Thus, the voltage values applied to the bit line BL and the source line SL in the memory cell 2 are reduced irrespective of a high charge storage gate voltage needed to inject charge into the charge storage layer EC by the quantum tunneling effect. The voltage values applied to the bit line and the source line are reduced to a voltage value required for the first select gate structure 5 to block the electrical connection between the bit line BL and the channel layer CH and a voltage value required for the second select gate structure 6 to block the electrical connection between the source line SL and the channel layer CH. Therefore, in accordance with the reduction in voltages applied to the bit line BL and the source line SL in the memory cell 2, the thickness of the first select gate insulating film 30 of the first select gate structure 5 and the thickness of the second select gate insulating film 33 of the second select gate structure 6 are reduced. Thereby, high-speed operation is achieved correspondingly.

(6) Other Embodiments

The present invention is not limited to the present embodiment, and various modifications are possible within the scope of the present invention. For example, the above-described embodiment describes the memory cell 2, in which the nitride sidewall layer 32a is disposed at a predetermined distance from the first select gate structure 5, and the nitride sidewall layer 32b is disposed at a predetermined distance from the second select gate structure 6, but the present invention is not limited thereto. As illustrated in FIG. 6A, in which any corresponding part to that in FIG. 1 is denoted by an identical reference numeral, the present invention is applicable to a memory cell 41, in which a nitride sidewall layer 45a disposed in a first sidewall spacer 42a is in contact with the sidewall of the first select gate structure 5, and a nitride sidewall layer 45b disposed in a second sidewall spacer 42b is in contact with the sidewall of the second select gate structure 6.

In this case, in the sidewall spacers 42a and 42b, the nitride sidewall layers 45a and 45b having wall shapes are each disposed at a predetermined distance from the memory gate structure 4 and extends along the corresponding sidewall of the memory gate structure 4. Insulating layers 44 made of, for example, SiO$_2$ are formed in regions other than the nitride sidewall layers 45a and 45b in the sidewall spacers 42a and 42b.

In another embodiment, a memory cell 51 may be used as illustrated in FIG. 6B, in which any corresponding part to that in FIG. 1 is denoted by an identical reference numeral. The memory cell 51 includes L-shaped nitride sidewall layers 55a and 55b, which are respectively disposed in insulating layers 54 of sidewall spacers 52a and 52b. In this case, the nitride sidewall layer 55a includes a wall portion 56a extending along a sidewall of the memory gate structure 4, and a lower end portion 57a. The lower end portion 57a is integrally formed with a lower end of the wall portion 56a and extends along the surface of the memory well MW toward the first select gate electrode DG. The nitride sidewall layer 55b includes a wall portion 56b extending along another sidewall of the memory gate structure 4, and a lower end portion 57b. The lower end portion 57b is integrally formed with a lower end of the wall portion 56b and extends along the surface of the memory well MW toward the second select gate electrode SG.

In this case, the nitride sidewall layers 55a and 55b are apart from the charge storage layer EC and includes the wall portions 56a and 56b each disposed along the corresponding sidewall of the memory gate structure 4 and at a predetermined distance from the memory gate structure 4. The distance between the surface of the memory well MW and each of lower surfaces of the lower end portions 57a and 57b is greater than the thickness of the lower gate insulating film 24a. The insulating layer 54 is disposed between the wall portion 56a of the nitride sidewall layer 32a and the first select gate structure 5, and the insulating layer 54 is disposed between the wall portion 56b of the nitride sidewall layer 32b and the second select gate structure 6.

In the above-described embodiment, the P-type memory well MW may be employed together with the memory gate structure 4 included in the N-type transistor structure, the first select gate structure 5 included in the N-type MOS transistor structure, and the second select gate structure 6 included in the N-type MOS transistor structure. However, the present invention is not limited thereto. An N-type memory well may be employed together with a memory gate structure included in a P-type transistor structure, a first select gate structure included in a P-type MOS transistor structure, and a second select gate structure included in a P-type MOS transistor structure.

In this case, conduction types (N type and P type) are opposite to those of the memory cell 2 described in the above-described embodiment, and voltages applied to the memory gate structure, the first select gate structure, the second select gate structure, the bit line, and the source line vary accordingly. In this case, similar to the above-described embodiment, voltages applied to the bit line and the source line are reduced to voltage values required for the memory well to become a non-conductive state in regions of the memory well below the first select gate structure and the second select gate structure, irrespective of the charge storage gate voltage applied to the memory gate electrode. The reduction in the voltage values applied to the bit line and the source line allows reduction in the thickness of the first select gate insulating film of the first select gate structure and the thickness of the second select gate insulating film of the second select gate structure. Thereby high-speed operation is achieved and the areas of peripheral circuits are reduced.

In the above-described embodiment, data is programmed by injecting charge into the charge storage layer EC of the memory cell 2, and data is erased by removing charge from the charge storage layer EC. However, the present invention is not limited thereto. An opposite configuration may be applied in which data is programmed by removing charge from the charge storage layer EC of the memory cell 2, and data is erased by injecting charge in the charge storage layer EC.

REFERENCE SIGNS LIST 2 memory cell
4 memory gate structure
5 first select gate structure
6 second select gate structure
28a, 28b, 42a, 42b, 52a, 52b sidewall spacer
31 drain region
32a, 32b, 45a, 45b, 55a, 55b nitride sidewall layer (sidewall layer)
34 source region
56a, 56b wall portion
57a, 57b lower end portion
D depletion layer
BL bit line
SL source line
MGL memory gate line
MW memory well
MG memory gate electrode
DG first select gate electrode
SG second select gate electrode
EC charge storage layer
SL lower surface

The invention claimed is:
1. A memory cell comprising:
a memory well;
a drain region disposed on a memory well surface of the memory well and connected to a bit line;
a source region disposed on the memory well surface and connected to a source line;
a memory gate structure disposed between the drain region and the source region and including a lower memory gate insulating film, a charge storage layer, an upper memory gate insulating film, and a memory gate electrode stacked in this order over the memory well, the memory gate structure having a first sidewall and a second sidewall;
a first select gate structure disposed between the drain region and the memory gate structure and including a first select gate insulating film disposed on the memory well and including a first select gate electrode disposed on the first select gate insulating film;
a second select gate structure disposed between the source region and the memory gate structure and including a second select gate insulating film disposed on the memory well and including a second select gate electrode disposed on the second select gate insulating film;
a first sidewall spacer disposed between the memory gate structure and the first select gate structure and including a first insulating layer and a first sidewall layer disposed in the first insulating layer, the first sidewall layer being made of an insulating material different from an insulating material of the first insulating layer, the first sidewall layer being disposed along the first sidewall of the memory gate structure and at a predetermined distance from the first sidewall of the memory gate structure such that the first sidewall layer is apart from the charge storage layer; and
a second sidewall spacer disposed between the memory gate structure and the second select gate structure and including a second insulating layer and a second sidewall layer disposed in the second insulating layer, the second sidewall layer being made of an insulating material different from an insulating material of the second insulating layer, the second sidewall layer being disposed along the second sidewall of the memory gate structure and at the predetermined distance from the second sidewall of the memory gate structure such that the second sidewall layer is apart from the charge storage layer,
wherein a distance between the memory well surface and a lower surface of each of the first and second sidewall layers is greater than a thickness of the lower memory gate insulating film,
the first sidewall layer is disposed in the first sidewall spacer to separate the memory gate electrode from the first select gate electrode,
the second sidewall layer is disposed in the second sidewall spacer to separate the memory gate electrode from the second select gate electrode,
a width of each of the first and second sidewall spacers is greater than or equal to 5 nm, and
a thickness of each of the first and second select gate insulating films is less than or equal to 3 nm.
2. The memory cell according to claim 1, wherein
the first sidewall layer includes a first wall portion and a first lower end portion, the first wall portion extending along the first sidewall of the memory gate structure, the first lower end portion being integrated with a lower end of the first wall portion and extending along the memory well surface toward the first select gate electrode, and
the second sidewall layer includes a second wall portion and a second lower end portion, the second wall portion extending along the second sidewall of the memory gate structure, the second lower end portion being integrated with a lower end of the second wall portion and extending along the memory well surface toward the second select gate electrode.

3. The memory cell according to claim 1, wherein the distance between the memory well surface and the lower surface of each of the first and second sidewall layers is 10 nm or more.

4. The memory cell according to claim 1, wherein a height of each of the first select gate structure and the second select gate structure from the memory well is less than or equal to a height of the memory gate structure.

5. The memory cell according to claim 1, wherein each of the first and second sidewall layers is a nitride sidewall layer.

6. A non-volatile semiconductor memory device comprising a plurality of memory cells according to claim 1, the plurality of memory cells being disposed in a matrix of rows and columns and being connected by at least one bit line and at least one source line.

7. A memory cell comprising:
a memory well;
a drain region disposed on a memory well surface of the memory well and connected to a bit line;
a source region disposed on the memory well surface and connected to a source line;
a memory gate structure disposed between the drain region and the source region and including a lower memory gate insulating film, a charge storage layer, an upper memory gate insulating film, and a memory gate electrode stacked in this order over the memory well, the memory gate structure having a first sidewall and a second sidewall;
a first select gate structure disposed between the drain region and the memory gate structure and including a first select gate insulating film disposed on the memory well and including a first select gate electrode disposed on the first select gate insulating film;
a second select gate structure disposed between the source region and the memory gate structure and including a second select gate insulating film disposed on the memory well and including a second select gate electrode disposed on the second select gate insulating film;
a first sidewall spacer disposed between the memory gate structure and the first select gate structure and including a first insulating layer and a first sidewall layer disposed in the first insulating layer, the first sidewall layer being made of an insulating material different from an insulating material of the first insulating layer, the first sidewall layer being disposed along the first sidewall of the memory gate structure and at a predetermined distance from the first sidewall of the memory gate structure such that the first sidewall layer is apart from the charge storage layer; and
a second sidewall spacer disposed between the memory gate structure and the second select gate structure and including a second insulating layer and a second sidewall layer disposed in the second insulating layer, the second sidewall layer being made of an insulating material different from an insulating material of the second insulating layer, the second sidewall layer being disposed along the second sidewall of the memory gate structure and at the predetermined distance from the second sidewall of the memory gate structure such that the second sidewall layer is apart from the charge storage layer,
wherein a distance between the memory well surface and a lower surface of each of the first and second sidewall layers is greater than a thickness of the lower memory gate insulating film,
the first sidewall layer is disposed in the first sidewall spacer to separate the memory gate electrode from the first select gate electrode,
the second sidewall layer is disposed in the second sidewall spacer to separate the memory gate electrode from the second select gate electrode,
the first sidewall layer is in contact with a sidewall of the first select gate structure, and
the second sidewall layer is in contact with a sidewall of the second select gate structure.

* * * * *